United States Patent
Kang et al.

(10) Patent No.: US 7,468,907 B2
(45) Date of Patent: **\*Dec. 23, 2008**

(54) PROGRAMMING METHOD FOR FLASH MEMORY CAPABLE OF COMPENSATING REDUCTION OF READ MARGIN BETWEEN STATES DUE TO HOT TEMPERATURE STRESS

(75) Inventors: Dong-Ku Kang, Seongnam-si (KR); Young-Ho Lim, Yongin-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

This patent is subject to a terminal disclaimer.

(21) Appl. No.: 11/522,406

(22) Filed: Sep. 18, 2006

(65) Prior Publication Data

US 2007/0159889 A1    Jul. 12, 2007

(30) Foreign Application Priority Data

Jan. 12, 2006    (KR) .................... 10-2006-003584

(51) Int. Cl.
*G11C 16/04*    (2006.01)
(52) U.S. Cl. ..................... 365/185.03; 365/185.22; 365/185.24
(58) Field of Classification Search ............ 365/185.03, 365/185.22, 185.21, 185.24, 185.28, 185.02
See application file for complete search history.

(56) References Cited

U.S. PATENT DOCUMENTS

| 7,031,193 B2 * | 4/2006 | Micheloni et al. | 365/185.22 |
| 7,085,168 B2 * | 8/2006 | Lee et al. | 365/185.24 |
| 2007/0159892 A1 * | 7/2007 | Kang et al. | 365/185.24 |

FOREIGN PATENT DOCUMENTS

| JP | 10214492 | 8/1998 |
| JP | 2000222893 | 8/2000 |
| KR | 1020050018943 | 2/2005 |
| KR | 1020060107689 A | 10/2006 |
| WO | 2004006266 A1 | 1/2004 |

* cited by examiner

*Primary Examiner*—David Lam
(74) *Attorney, Agent, or Firm*—Volentine & Whitt, PLLC

(57) ABSTRACT

A program method of a flash memory device including a plurality of memory cells for storing multi-bit data indicating one of states. The program method includes programming memory cells selected to have one of the states by using multi-bit data; detecting programmed memory cells within a predetermined region of a threshold voltage distribution where the programmed memory cells having the respective states are distributed, wherein the predetermined region of the respective states is selected by one of a first verify voltage and a read voltage and a second voltage, the first verify voltage being lower than the second verify voltage and higher than the read voltage; and programming the detected memory cells to have a threshold voltage being equivalent to or higher than the second verify voltage corresponding to each of the states.

17 Claims, 7 Drawing Sheets

Programmed Memory Cell     Memory Cell To Be Programmed

PROGRAMMING METHOD FOR FLASH MEMORY CAPABLE OF COMPENSATING REDUCTION OF READ MARGIN BETWEEN STATES DUE TO HOT TEMPERATURE STRESS

BACKGROUND OF THE INVENTION

1. Field of the Invention

Embodiments of the invention relate to a flash memory device and, more particularly, to a programming method adapted for use with a flash memory device.

This application claims priority under 35 U.S.C § 119 to Korean Patent Application 2006-03584 filed on Jan. 12, 2006, the subject matter of which is hereby incorporated by reference.

2. Description of the Related Art

In recent years, volatile and non-volatile memory devices have been incorporated into a host of mobile appliances, such as MP3 players, cellular telephones, portable multimedia players (PMPs), notebook computers, personal digital assistances (PDAs), etc., in ever greater quantities. Emerging mobile appliances require large quantities of digital data storage to support functionality, such as motion picture playback, etc.

Great effort has been expended to meet the demand for ever expanding memory in mobile appliances. One result of this effort is the development of multi-bit memory devices capable of storing greater than a single (1) bit (e.g., a logical "1" or "0") of data per memory cell. Exemplary multi-bit memory devices are disclosed, for example, in U.S. Pat. No. 6,122,188; U.S. Pat. No. 6,075,734; and U.S. Pat. No. 5,923,587, the subject matter of which is hereby incorporated by reference.

When 1-bit data is stored in a memory cell, the memory cell will exhibit one of two possible threshold voltage distributions, i.e., the memory cell will be programmed (or written) to have one of two data states corresponding to a logical "0" or "1". Each threshold voltage corresponding to a data state actually appears within an expected voltage distribution—hence the term "threshold voltage distribution". On the other hand, when 2-bit data is stored in a memory cell, the memory cell will exhibit one of four threshold voltages (i.e., one distribution amongst four possible threshold voltage distributions). These threshold voltages distributions correspond to four (4) logic data states "11", "10", "00", and "01". Threshold voltage distributions corresponding to four states (ST0, ST1, ST2, and ST3) are illustrated in Figure (FIG.) 1.

Ideally, threshold voltage distributions corresponding to four data states should be carefully controlled such that each threshold voltage distribution exists within a predetermined range or "window." In order to achieve this goal, one conventional programming method uses an increment step pulse programming (ISPP) scheme. In the ISPP scheme, a threshold voltage shifts by a defined increment of programming voltage in accordance with the repetitive application of one or more programming loops. By setting the programming voltage increment to a small value, threshold voltage distributions may be minutely controlled to secure adequate voltage discrimination margin between respective data states. Unfortunately, the ISSP and similar schemes significantly increase the time required to program a memory cell to a desired data state, particularly for small increment sizes. Accordingly, the size of the program voltage increment will be defined in relation to maximum programming time parameters for a particular memory device.

The application of the ISPP or similar scheme notwithstanding, the corresponding threshold voltage distribution for each data state may be wider than a desired window due to various causes. For example, as indicated by dotted lines 10, 11, 12, and 13 in FIG. 1, respective threshold voltage distributions may expand due to coupling effects between adjacent memory cells during a programming operation. Such a coupling is referred to as "electric field coupling" or "F-poly coupling".

For example, as illustrated in FIG. 2, assuming that a first memory cell (MCA) and a second memory cell (MCB) are being programmed to have, respectively, any on one of four states, electrical charge accumulates on the floating gate (FG) of memory cell MCB as it is programmed. In turn, a voltage apparent on the floating gate of adjacent memory cell MCA rises due to coupling between the adjacent floating gates of memory cells MCA and MCB. Worse yet, the raised threshold voltage now apparent on the floating gate of memory cell MCA is retained due to the coupling between adjacent floating gates even after programming of memory cell MCB is completed. In this example, memory cell MCB is indicative of memory cells arranged in a wordline direction and/or a bitline direction relative to memory cell MCA.

Due to foregoing coupling effects, the ideal threshold voltages for programmed memory cell MCA expand as indicated by the dotted lines 10, 11, 12, and 12 of FIG. 1. Accordingly, the data state discrimination margin (i.e., the "read margin") between states is reduced.

One conventional technique adapted to preventing the expansion of threshold voltage distributions due to coupling effects is disclosed, for example, in U.S. Pat. No. 5,867,429, the subject matter of which is hereby incorporated by reference.

In addition to the foregoing electric field and/or F-poly coupling effects, the read margin between memory cell states may be further reduced as memory cell threshold voltages tend to drop over time. This phenomenon has been conventionally examined and is referred to as "hot temperature stress (HTS)". Under the influence of HTS, charge accumulated on the floating gate of a memory cell drains away into the substrate of the memory device. As accumulated charge on the floating gate is thus reduced, the threshold voltage distributions for the memory cell expand in the direction indicated by dotted lines 20, 21, and 22 of FIG. 3.

Accordingly, the expansion of threshold voltage distributions due to an electric field and/or F-poly coupling effects and HTS present a doubly difficult problem to memory system designers seeking to maintain read margins between memory cell data states. And this problem has only been exacerbated by recent commercial trends toward more complex semiconductor fabricating processes and more densely integrated semiconductor devices.

Accordingly, there exists a requirement to secure additional read margin between memory cell data states (e.g., the corresponding voltage distributions) by controlling for or mitigating the effects of electric field and/or F-poly coupling as well as HTS.

SUMMARY OF THE INVENTION

In one embodiment, the invention provides a programming method for a flash memory device having a plurality of memory cells storing multi-bit data indicating one of a plurality of states, the programming method comprising; programming memory cells selected to have one of the plurality of states using multi-bit data, detecting programmed memory cells within a predetermined region of a threshold voltage distribution, wherein the programmed memory cells have one of the plurality of states, wherein the predetermined region is selected by one of a first verify voltage and a read voltage and a second voltage, the first verify voltage being lower than the second verify voltage and higher than the read voltage, and programming the detected memory cells to have a threshold voltage being equivalent to or higher than the second verify voltage corresponding to the respective states.

In another embodiment, the invention provides a programming method for a flash memory device having a plurality of memory cells storing multi-bit data indicating one of first through fourth states, the programming method comprising; programming memory cells selected to have one of the states using multi-bit data, detecting programmed memory cells within a predetermined region of a threshold voltage distribution where the programmed memory cells having one of the first through fourth states are distributed, wherein the predetermined region is selected by one of a first verify voltage and a read voltage and a second voltage, the first verify voltage being lower than the second verify voltage and higher than the read voltage, and programming the detected memory cells to have a threshold voltage being equivalent to or higher than the second verify voltage corresponding to each of the states.

DESCRIPTION OF EMBODIMENTS

Figure 1:
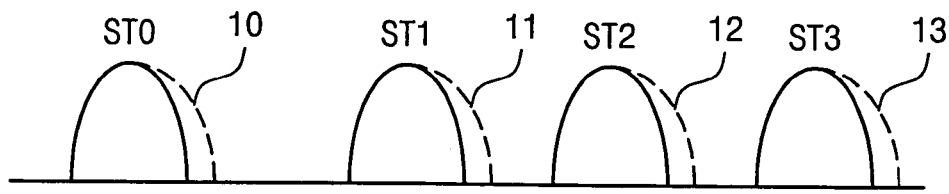
FIG. 1 illustrates expanded threshold voltage distributions due to electric field and/or F-poly coupling effects
Figure 2:
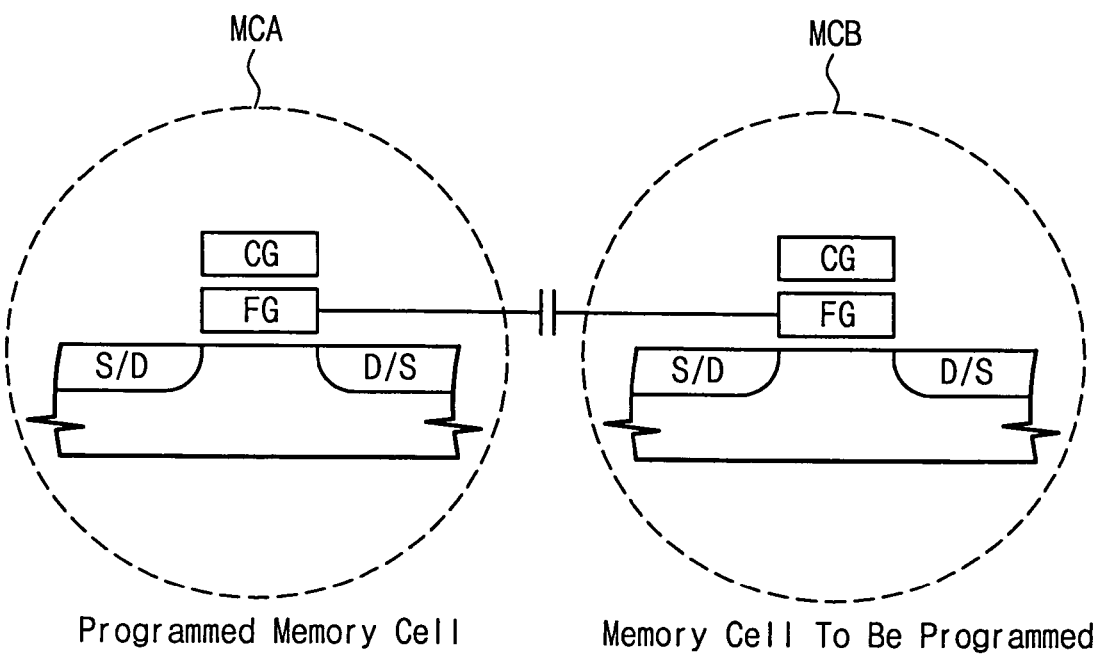
FIG. 2 illustrates the electric field and/or F-poly coupling effects generated between adjacent memory cells.

The present invention will now be described in some additional detail with reference to the accompanying drawings. This invention may, however, be embodied in many different forms and should not be construed as being limited to only the embodiments set forth herein. Rather, these embodiments are presented as teaching examples. In the drawings, like numbers refer to like or similar elements.

Figure 4:
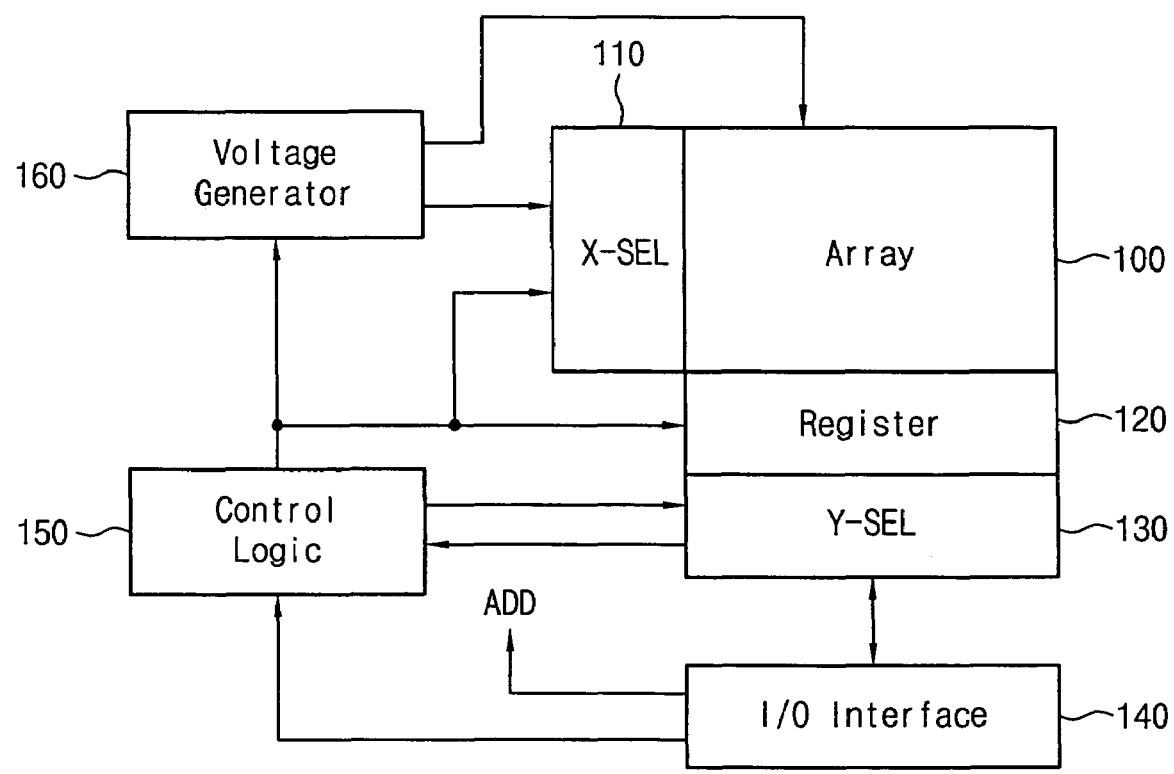
FIG. 4 is a block diagram of an exemplary flash memory device according to an embodiment of the invention.
Figure 5:
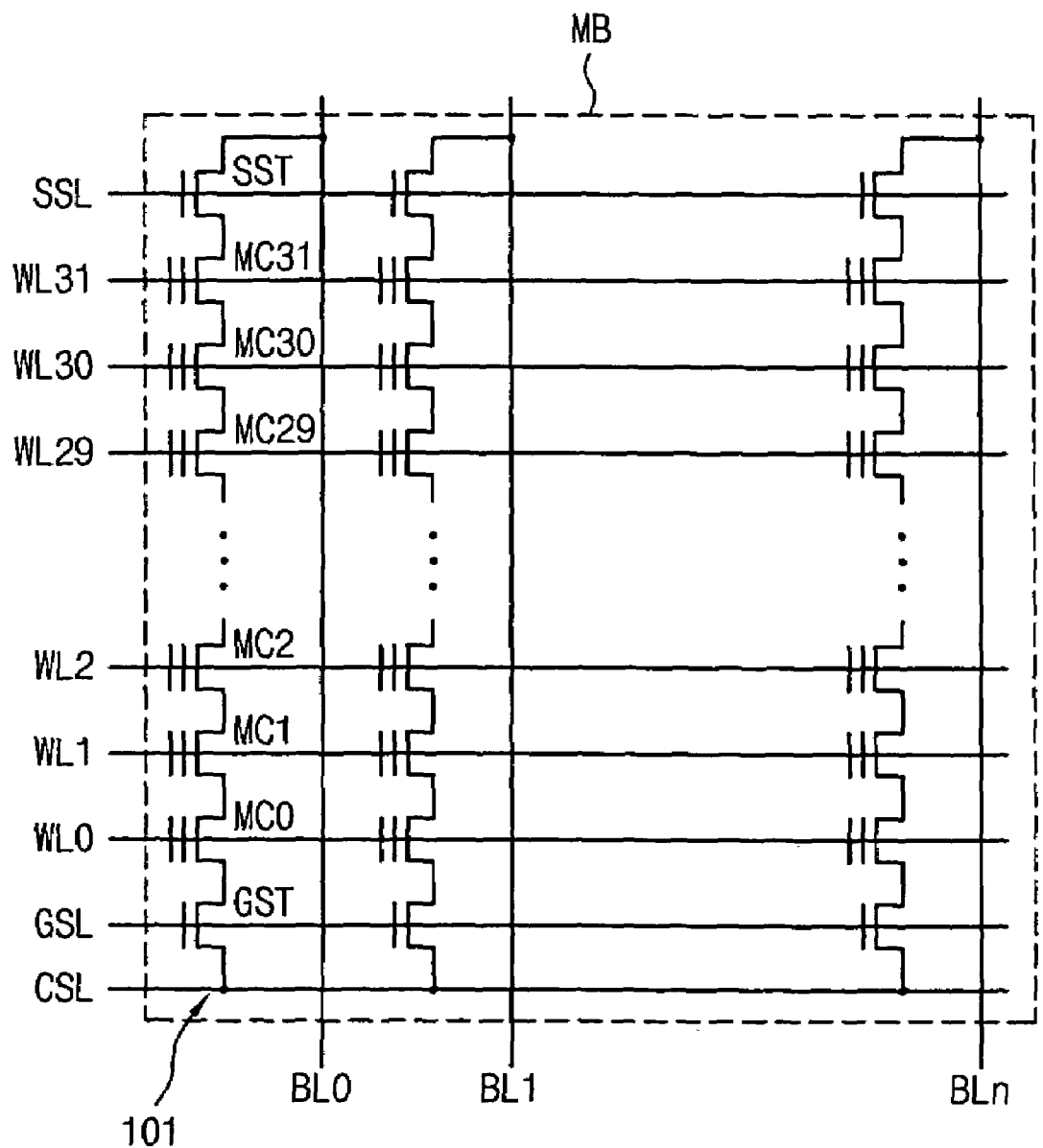
FIG. 5 is a circuit diagram further illustrating the memory cell array of FIG. 4.

FIG. 4 is a block diagram of a flash memory device according to an embodiment of the invention. FIG. 5 is a circuit diagram further illustrating the memory cell array of FIG. 4.

Referring to FIG. 4, the illustrated flash memory device includes a memory cell array 100 adapted to store data. Memory cell array 100 includes a plurality of memory blocks each having a memory cell configuration illustrated in FIG. 5.

As illustrated in FIG. 5, a memory block MB includes a plurality of memory cell strings 101 each having a string select transistor SST, a ground select transistor GST, and a plurality of memory cells (e.g., MC31-MC0). String selection transistor SST is controlled by a string select line SSL and has a drain connected to a corresponding bitline. Memory cells MC31-MC0 are serially coupled between the source of string select transistor SST and the drain of ground select transistor GST and are respectively controlled by corresponding wordlines WL31-WL0. It will be understood by those skilled in the art that the number of wordlines illustrated in FIG. 5 is merely exemplary. Each memory cell comprises of a floating gate transistor.

Returning to FIG. 4, a row selector circuit (X-SEL) 110 is controlled by a control logic 150. Row selector circuit 100 selects one of the plurality of memory blocks in response to an address (ADD) provided through an input/output interface (I/O interface) 140 and controls rows (including wordlines and select lines) of the selected memory block. A register block 120 is also controlled by control logic 150 and functions as a sense amplifier or a write driver according to the present operational mode (e.g., read/program). Although not illustrated in FIG. 4, register block 120 comprises a number of page buffers, as is conventionally understood. Each page buffer is electrically connected to one bitline or one of a pair of bitlines and either reads data from a memory cell, or stores data in the memory cell through a bitline. A column selector circuit (Y-SEL) 130 is controlled by control logic 150 and outputs data stored in register block 120 to I/O interface 140 or control logic 150 in response to the address ADD provided through I/O interface 140. For example, in a normal read operation, column selector circuit 130 outputs data stored in register block 120 to I/O interface 140. In a verify normal read operation, column selector circuit 130 outputs data stored in register block 120 to control logic 150 and control logic 150 determines whether the data provided from column selector circuit 130 is "pass" data.

During a data loading period of a programming operation, column selector circuit 130 outputs program data transferred through I/O interface 140 to register block 120. Control logic 150 is configured to control general operations of a flash memory device. A voltage generator 160 is also controlled by control logic 150 and configured to generate voltages (e.g., a wordline voltage, a bulk voltage, a read voltage, a pass voltage, etc.) required for program/erase/read operations.

As described below, a flash memory device according to an embodiment of the invention incorporates a novel programming approach adapted to secure additional read margin between memory cell data states even under conditions where constituent memory cells are subjected to electric field and/or F-poly coupling effects and HTS. According to a programming operation consistent with one embodiment of the invention, 2-bit data is stored in respective memory cells of a selected page so that memory cells are programmed using target threshold voltages of respective desired states. This method step will hereinafter be generally referred to as a "first programming operation". After the first programming operation is completed, read operations are executed to detect memory cells arranged within a predetermined threshold voltage region among the memory cells of the respective states. The detected memory cells are programmed to have a higher threshold voltage than target threshold voltages of the respective states. This method step will hereinafter be generally referred to as a "second programming operation".

The first programming operation for storing 2-bit data will vary with the configuration of register block 120. For example, after loading both LSB and MSB data bits into register block 120, the first programming operation may be executed. Alternatively, programming MSB data bit (hereinafter generally referred to as the "MSB programming operation") may be followed by programming LSB data bit (hereinafter generally referred to as the "LSB programming operation"). This latter operation is hereafter presented as an exemplary programming method, and be described in some additional detail with reference to FIGS. 6A and 6B.

One memory cell is programmed to have one of "11", "10", "00", and "01" states. For convenience of description, only, it is assumed that the "11", "10", "00", and "01" states correspond to ST0, ST1, ST2, and ST3, respectively. A memory cell having the "11" state is an erased memory cell, and a threshold voltage of a memory cell having the "10" state is higher than that of a memory cell having the "11" state. A threshold voltage of a memory cell having the "00" state is higher than that of a memory cell having the "10" state. Further, a threshold voltage of a memory cell having the "01" state is higher than that of a memory cell having the "00" state.

Figure 6A:
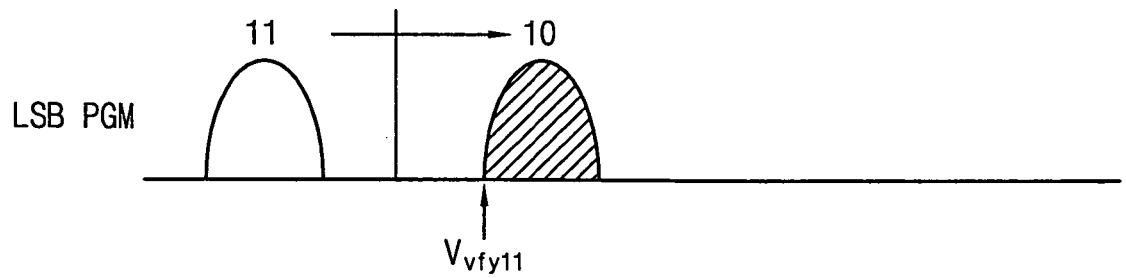
FIG. 6A and FIG. 6B illustrate a multi-bit programming operation according an embodiment of the invention.
Figure 6B:
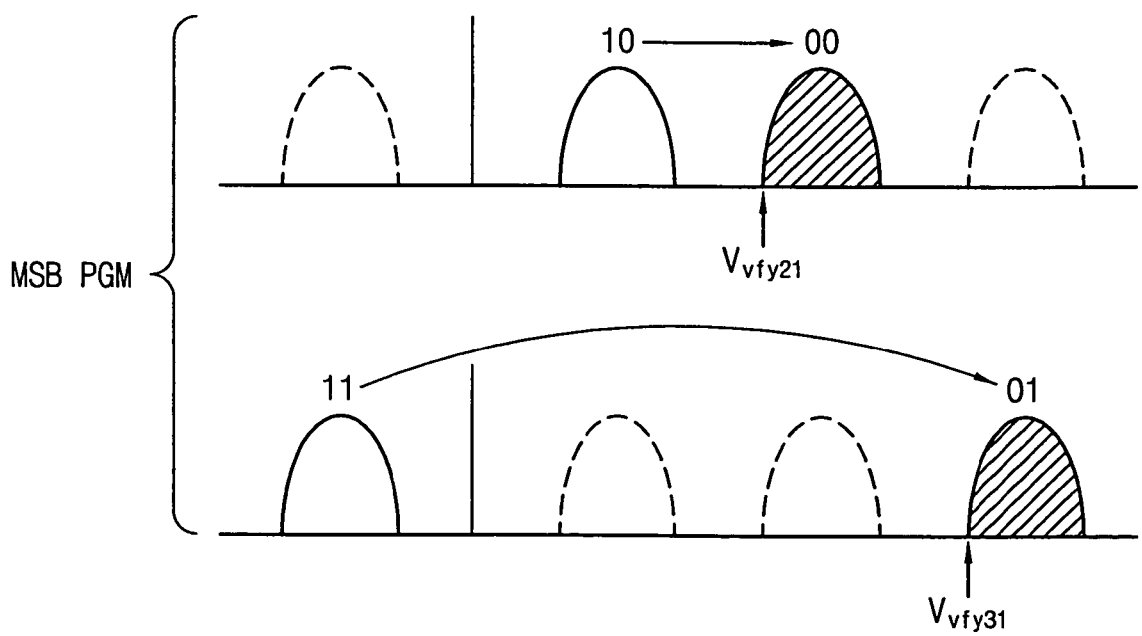
Figure 6B:
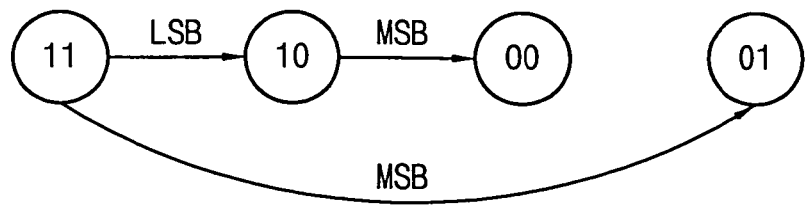

If an LSB programming operation is executed under the foregoing assumptions, a memory cell having an erased state or a "10" state is illustrated in FIG. 6A. If an MSB programming operation is executed following the LSB programming operation, a memory cell having the "11" state has an erased state or a "01" state while a memory cell having the "10" state has a "10" or "00" state, as illustrated in FIG. 6B.

Figure 7A:
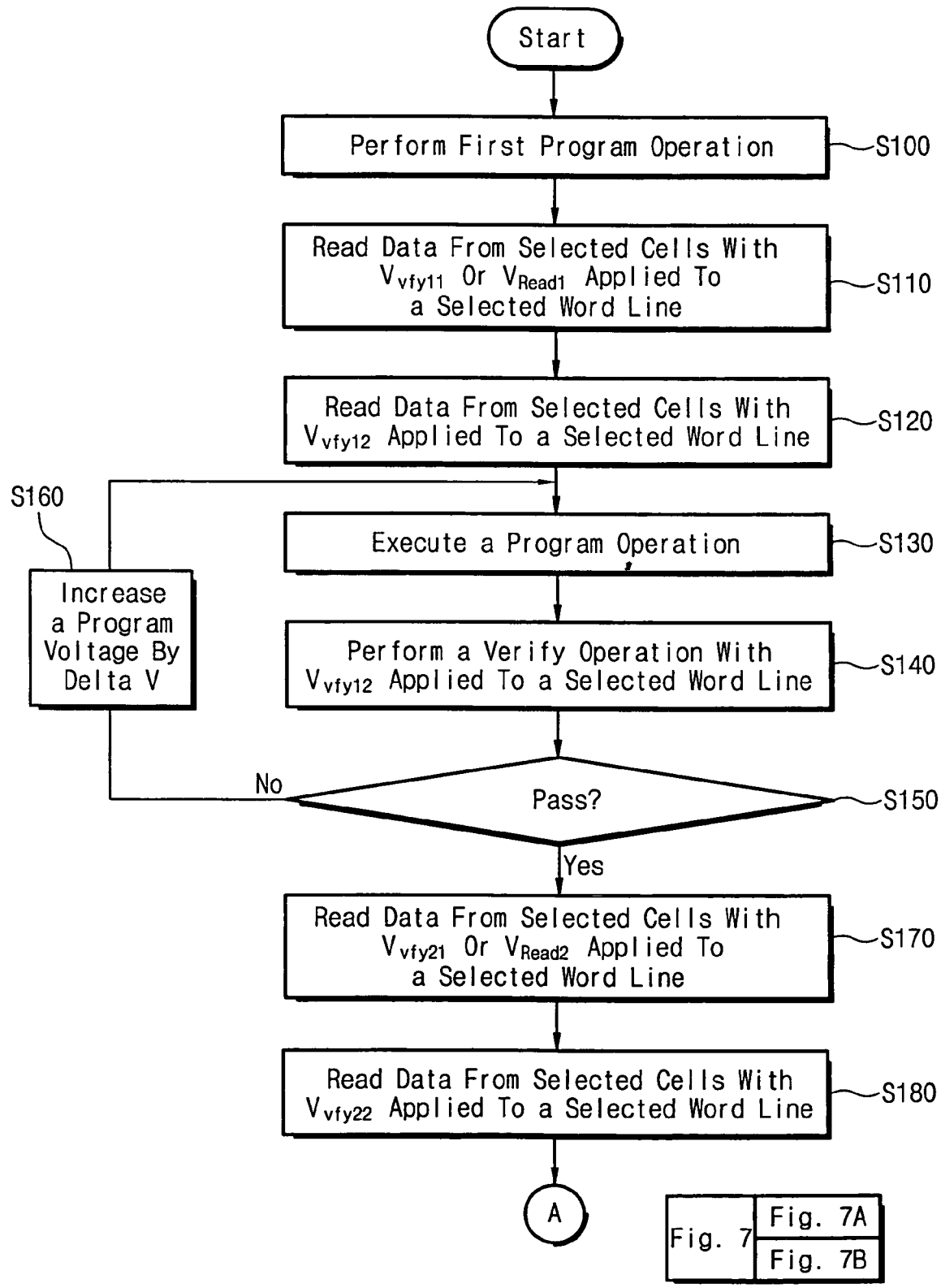
FIGS. 7A and 7B are a flowchart illustrating a programming method for a flash memory device according to an embodiment of the invention.
Figure 7B:
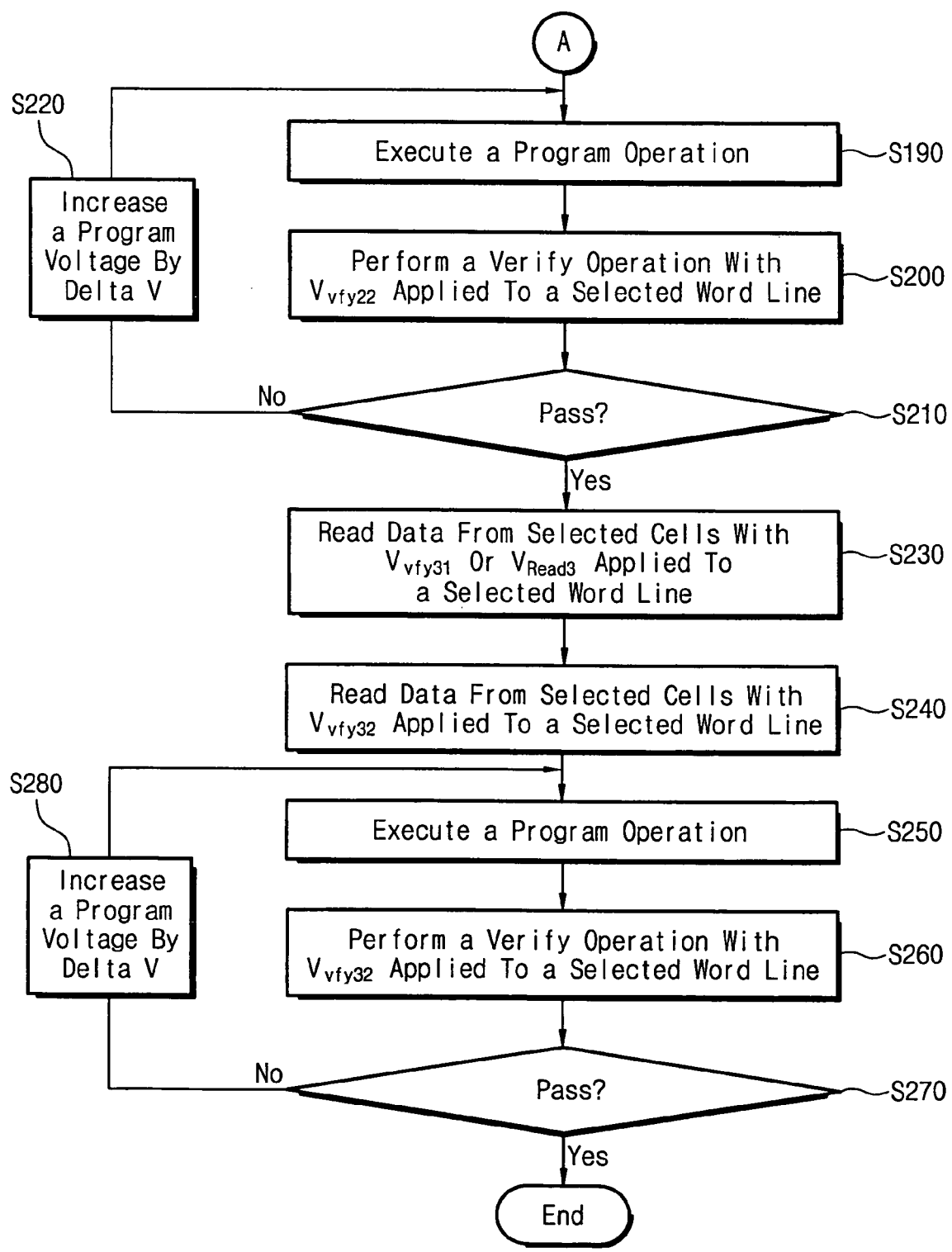
Figure 8:
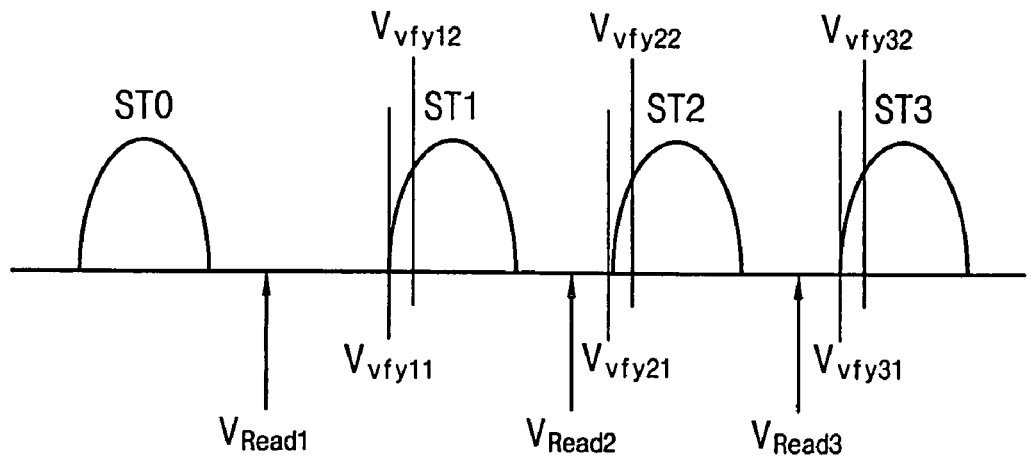
FIG. 8 illustrates verify voltages adapted for use in the execution of a programming operation for a flash memory device according to an embodiment of the invention.

FIG. 7, comprising collectively FIGS. 7A and 7B, is a flowchart illustrating an exemplary programming method for a flash memory device according to an embodiment of the invention. FIG. 8 illustrates verify voltages adapted for use when executing a programming operation for a flash memory device according to an embodiment of the invention.

A first programming operation is executed according to the program method described with reference to FIG. 6A and FIG. 6B (S100). While the first program operation is executed, memory cells of a selected page are programmed to one of states ST1, ST2, and ST3 of FIG. 8. Using verify voltages Vvfy11, Vvfy21, and Vvfy31 corresponding to the states ST1, ST2, and ST3, it is determined whether they are programmed to the respective states. For example, using the verify voltage Vvfy11, it is determined whether a memory cell is programmed to the ST1 state; using the verify voltage Vvfy21, it is determined whether a memory cell is programmed to the ST2 state; and using the verify voltage Vvfy31, it is determined whether a memory cell is programmed to the ST3 state.

Once the first program operation for 2-bit data is completed, selected are memory cells arranged within a specific region among threshold voltage distributions each corresponding to the states ST1, ST2, and ST3.

While a verify voltage Vvfy11 (or read voltage Vread1) is applied to a selected wordline, a read operation is executed through register block 120 (S110). Next, while a verify voltage Vvfy12 higher than the verify voltage Vvfy11 is applied to the selected wordline, a read operation is executed through register block 120 (S120). Due to these two read operations, memory cells are detected that have a threshold voltage existing between verify voltages Vvfy11 and Vvfy12 (or Vread and Vvfy12). (See, FIG. 8). It will be understood by those skilled in the art that methods of detecting memory cells having threshold voltages existing between verify voltages Vvfy11 and Vvfy12 (or the read voltage Vread and the verify voltage Vvfy12) may vary with the configuration of register block 120.

Once the memory cells having the threshold voltages existing between verify voltages Vvfy11 and Vvfy12 (or the read voltage Vread1 and the verify voltage Vvfy12) are detected, a programming operation is executed for the detected memory cells (S130). While a verify voltage Vvfy12 is applied to a selected wordline as a read voltage, a verify read operation is executed (S140). It is determined whether the detected memory cells are programmed to have a threshold voltage corresponding to the verify voltage Vvfy12 (S150). If the determination results indicate that all of the detected memory cells are not programmed with a required threshold voltage, the program voltage applied to the selected wordline is increased by a predetermined increment (S160). Thereafter, in the illustrated example, the method returns to step S130. A programming loop, collectively comprising steps S130-S160, is repeated a predetermined number of iterations or until the detected memory cells are all properly programmed.

If the determination results indicate that all the detected memory cells are programmed with a required threshold voltage, a read operation is executed through register block 120 while the verify voltage Vvfy21 (or a read voltage Vread2) is applied to the selected wordline (S170). While a verify voltage Vvfy22 higher than the verify voltage Vvfy21 is applied to the selected wordline, a read operation is executed through register block 120 (S180). Due to these two read operations, memory cells are detected that have a threshold voltage existing between verify voltages Vvfy21 and Vvfy22 (or a read voltage Vread2 and the verify voltage Vvfy22). (See, FIG. 8). Once memory cells having threshold voltages existing between verify voltages Vvfy21 and Vvfy22 (or Vread2 and Vvfy22) are detected, a programming operation is executed for the detected memory cells (S190). While verify voltage Vvfy22 is applied to the selected wordline as a read voltage, a verify read operation is executed (S200). It is determined whether the detected memory cells are programmed to have a threshold voltage corresponding to verify voltage Vvfy22 (S210). If the determination results indicate that all the detected memory cells are not programmed with a required threshold voltage, the program voltage applied to the selected wordline is increased by a predetermined increment (S220). Afterwards, in the illustrated example, the method returns to step S190. A programming loop, collectively comprising the steps of S190-S220, is repeated a predetermined number of iterations or until all the detected memory cells are properly programmed.

If the determination results indicate that all the detected memory cells are properly programmed with a required threshold voltage, a read operation is executed through register block 120 while verify voltage Vvfy31 (or a read voltage Vread3) is applied to the selected wordline (S230). While verify voltage Vvfy32 higher than the verify voltage Vvfy31 is applied to the selected wordline, a read operation is executed through register block 120 (S240). Due to these two read operations, memory cells are detected that have a threshold voltage existing between verify voltages Vvfy31 and Vvfy32 (or a read voltage Vread3 and the verify voltage Vvfy32). (See, FIG. 8). Once memory cells having threshold voltages existing between verify voltages Vvfy31 and Vvfy32 (or Vread3 and Vvfy32) are detected, a programming operation is executed for the detected memory cells (S250). While the verify voltage Vvfy32 is applied to the selected wordline as a read voltage, a verify read operation is executed (S260). It is determined whether the detected memory cells are programmed to have a threshold voltage corresponding to verify voltage Vvfy32 (S270). If the determination result indicates that all the detected memory cells are not programmed with a required threshold voltage, the program voltage applied to the selected wordline is increased by a predetermined increment (S280). Afterwards, in the illustrated example, the method returns to step S250. A programming loop, collectively comprising steps S250-S280, is repeated a predetermined number of iterations or until all the detected memory cells are properly programmed. If the determination result indicates that all the detected memory cells are properly programmed with a required threshold voltage, the programming operation to the illustrated embodiment of the invention may be ended.

Figure 9:
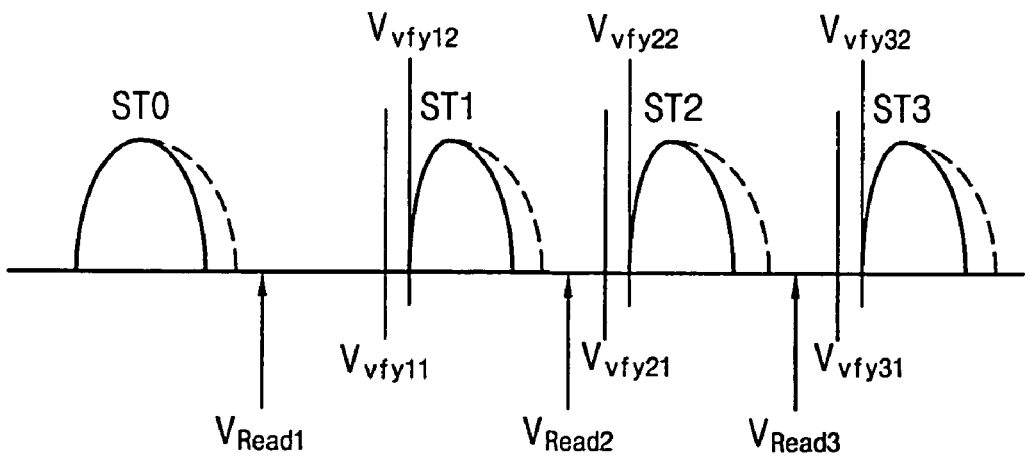
FIG. 9 illustrates exemplary threshold voltage distributions derived after execution of a programming operation for a flash memory device according to an embodiment of the invention.

FIG. 9 illustrates exemplary threshold voltage distributions following execution of a programming operation according to an embodiment of the invention.

Figure 3:
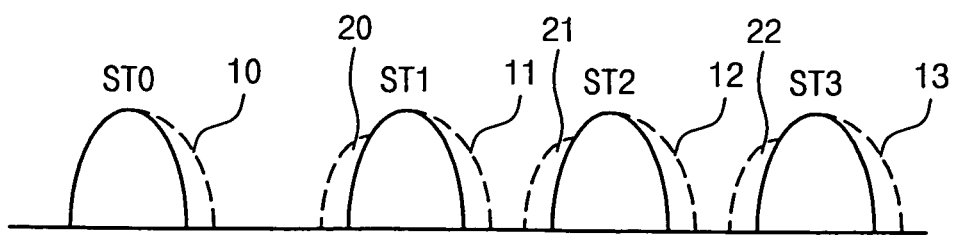
FIG. 3 illustrates expanded threshold voltage distributions caused by high temperature stress (HTS).

Referring to FIG. 9, in a threshold voltage distribution corresponding to a state ST1, memory cells existing between verify voltages Vvyf11 and Vvfy12 (or read and verify voltages Vread1 and Vvfy12) are programmed to have the verify voltage Vvfy12 or a voltage higher than the verify voltage Vvfy12. As may be seen from a comparison of FIG. 9 and FIG. 3, the read margin between states ST0 and ST1 is increased. In a threshold voltage distribution corresponding to a state ST2, memory cells existing between verify voltages Vvyf21 and Vvfy22 (or read and verify voltages Vread2 and Vvfy22) are programmed to have the verify voltage Vvfy22 or a voltage higher than the verify voltage Vvfy22. Again, as may be seen from a comparison of FIG. 9 and FIG. 3, the read margin between states ST1 and ST2 is increased. Similarly, in a threshold voltage distribution corresponding to a state ST3, memory cells existing between verify voltages Vvyf31 and Vvfy32 (or read and verify voltages Vread3 and Vvfy32) are programmed to have the verify voltage Vvfy32 or a voltage higher than the verify voltage Vvfy32. Here again, the read margin between states ST2 and ST3 increases. Namely, a read margin between adjacent states more increased over that shown in FIG. 3. Thus, although the constituent memory cells suffer under an expanded threshold voltage distribution due to electric field coupling and/or F-poly coupling and HTS, the read margins between adjacent data states may be sufficiently secured using the programming method according to embodiments of the invention.

It will be understood by those skilled in the art that a second applied programming operation to the foregoing embodiments is not in any way limited by this specification. For example, the greater the amount of electrical charge accumulated on the floating gate of a constituent memory cell, the greater the threshold voltage decreases will be due to HTS. Accordingly, a secondary programming operation may be executed for only states ST2 and ST3, or for only state ST3. In such cases, the secondary programming operation may be executed in a manner similar to that described above, and so need not be explained in further detail. Alternatively, a secondary programming operation may be executed by detecting all memory cells arranged within a specific region of each threshold voltage distribution and simultaneously programming the detected memory cells having states ST1, ST2, and ST3.

The voltages required to execute read operations on memory cells programmed using a programming method according to an embodiment of the invention may be set to be the same as read voltages used in the primary programming operation. A start program voltage applied to a wordline selected during the second programming operation for respective states may be differently set according to the states or equivalently set irrespective of the states. In the programming method according to the present invention, a program voltage may be increased by a predetermined increment for each programming loop repetition. The increment of the program voltage may be maintained irrespective of states, or it may vary with one or more states.

According to embodiments of the invention, after being subjected to a primary programming operation, memory cells arranged within a specific region of respective states may be subjected to a secondary programming operation to have a threshold voltage equivalent to or higher than a verify voltage of the primary program operation. Thus, although a threshold voltage distribution may be expanded due to electric field and/or F-poly coupling effects and HTS, the read margins between adjacent data states may be sufficiently secured using the programming method according to embodiments of the invention.

Although the present invention has been described in connection with the embodiment illustrated in the accompanying drawings, it is not limited thereto. It will be apparent to those skilled in the art that various substitution, modifications and changes may be thereto without departing from the scope of the invention as defined by the following claims.

What is claimed is:

1. A programming method for a flash memory device having a plurality of memory cells storing multi-bit data indicating one of a plurality of states, the programming method comprising:
   programming memory cells selected to have one of the plurality of states using multi-bit data;
   detecting programmed memory cells within a predetermined region of a threshold voltage distribution, wherein the programmed memory cells have one of the plurality of states,
   wherein the predetermined region is selected by one of a first verify voltage and a read voltage and a second verify voltage, the first verify voltage being lower than the second verify voltage and higher than the read voltage; and
   programming the detected memory cells to have a threshold voltage being equivalent to or higher than the second verify voltage corresponding to the respective states.

2. The programming method of claim 1, wherein first verify voltages corresponding to the respective ones of the plurality of states are used to determine whether the selected memory cells are programmed using multi-bit data.

3. The programming method of claim 1, wherein when the detected memory cells are programmed to have a threshold voltage equivalent to or higher than a second verify voltage corresponding to the respective states, program voltages applied to selected word lines vary with the states.

4. The programming method of claim 3, wherein the program voltage increases incrementally with repetition of a programming loop.

5. The programming method of claim 4, wherein the increment of the program voltage is maintained irrespective of the states.

6. The programming method of claim 4, wherein the increment of the program voltage is variable with the states.

7. The programming method of claim 1, wherein when the detected memory cells are programmed to have a threshold voltage equivalent to or higher than a second verify voltage corresponding to the respective states, program voltages applied to selected wordlines are equivalent to one another irrespective of the states.

8. A programming method for a flash memory device having a plurality of memory cells storing multi-bit data indicating one of first through fourth states, the programming method comprising:
   programming memory cells selected to have one of the states using multi-bit data;
   detecting programmed memory cells within a predetermined region of a threshold voltage distribution where the programmed memory cells having one of the first through fourth states are distributed, wherein the predetermined region is selected by one of a first verify voltage and a read voltage and a second verify voltage, the first verify voltage being lower than the second verify voltage and higher than the read voltage; and programming the detected memory cells to have a threshold voltage being equivalent to or higher than the second verify voltage corresponding to each of the states.

9. The programming method of claim 8, wherein the first state represents an erased state, and the detected memory cells store the second state.

10. The programming method of claim 9, further comprising:

detecting programmed memory cells arranged within a predetermined region of a threshold voltage distribution where the programmed memory cells of the third state are distributed, wherein the predetermined region of the third state is selected by either one of a first verify voltage and a read voltage, the first verify voltage being lower than the second verify voltage and higher than the read voltage; and programming the detected memory cells to have a threshold voltage equivalent to or higher than a second verify voltage corresponding to the third state.

11. The programming method of claim 10, further comprising:

detecting programmed memory cells arranged within a predetermined region of a threshold voltage distribution where programmed memory cells of the fourth state are distributed, wherein the predetermined region of the fourth state is selected by either one of a first verify voltage and a read voltage and a second verify voltage, the first verify voltage being lower than the second verify voltage and higher than the read voltage; and programming the detected memory cells to have a threshold voltage equivalent to or higher than a second verify voltage corresponding to the fourth state.

12. The programming method of claim 11, wherein first verify voltages corresponding to the second through fourth states are used to determine whether the selected memory cells are programmed using multi-bit data.

13. The programming method of claim 12, wherein when the detected memory cells are programmed to have a threshold voltage equivalent to or higher than a second verify voltage corresponding to the respective states, program voltages applied to selected word lines vary with the states.

14. The programming method of claim 13, wherein the program voltage increases incrementally with repetition of a programming loop.

15. The programming method of claim 14, wherein the increment of the program voltage is maintained irrespective of the second to fourth states.

16. The programming method of claim 14, wherein the increment of the program voltage is variable with the second to fourth states.

17. The programming method of claim 12, wherein when the detected memory cells are programmed to have a threshold voltage equivalent to or higher than a second verify voltage corresponding to the respective states, program voltages applied to selected wordlines are equivalent to one another irrespective of the states.

* * * * *